United States Patent
Park et al.

(10) Patent No.: US 9,960,107 B2
(45) Date of Patent: May 1, 2018

(54) PACKAGE SUBSTRATE, METHOD FOR FABRICATING THE SAME, AND PACKAGE DEVICE INCLUDING THE PACKAGE SUBSTRATE

(71) Applicant: Samsung Electronics Co., Ltd., Suwon-si, Gyeonggi-do (KR)

(72) Inventors: Soojae Park, Asan-si (KR); Kyujin Lee, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/385,062

(22) Filed: Dec. 20, 2016

(65) Prior Publication Data

US 2017/0194240 A1    Jul. 6, 2017

(30) Foreign Application Priority Data

Jan. 5, 2016    (KR) .................. 10-2016-0001002

(51) Int. Cl.
*H01L 23/498*    (2006.01)
*H01L 21/48*    (2006.01)
*H01L 23/00*    (2006.01)

(52) U.S. Cl.
CPC ...... *H01L 23/49838* (2013.01); *H01L 21/486* (2013.01); *H01L 21/4857* (2013.01);
(Continued)

(58) Field of Classification Search
CPC .............. H01L 21/4857; H01L 21/486; H01L 23/49822; H01L 23/49827; H01L 23/49866; H01L 23/49894; H01L 24/48; H01L 2224/32225; H01L 2224/48091; H01L 2224/48106; H01L 2224/48227; H01L 2224/48624
(Continued)

(56) References Cited

U.S. PATENT DOCUMENTS 6,794,248 B2 * 9/2004 Hashimoto ....... H01L 21/02063
257/E21.576
7,592,246 B2 * 9/2009 Akram .............. H01L 23/53238
438/612

(Continued)

FOREIGN PATENT DOCUMENTS

JP    2006/100395 A    4/2006
JP    2012/149289 A    8/2012
(Continued)

*Primary Examiner* — Timothy Thompson
*Assistant Examiner* — Michael F McCallister
(74) *Attorney, Agent, or Firm* — Harness, Dickey & Pierce, P.L.C.

(57) ABSTRACT

A package substrate including an insulating layer having a top surface and a bottom surface opposite to the top surface, at least one first copper pattern disposed in the insulating layer and adjacent to the top surface of the insulating layer, at least one second copper pattern disposed on the bottom surface of the insulating layer, and at least one embedded aluminum pad disposed on the at least one first copper pattern, the at least one embedded aluminum pad disposed in the insulating layer such that a top surface of the at least one embedded aluminum pad is exposed by the insulating layer may be provided.

20 Claims, 22 Drawing Sheets

(52) U.S. Cl.
CPC .. *H01L 23/49822* (2013.01); *H01L 23/49827* (2013.01); *H01L 23/49866* (2013.01); *H01L 23/49894* (2013.01); *H01L 24/48* (2013.01); *H01L 2224/32225* (2013.01); *H01L 2224/45144* (2013.01); *H01L 2224/45147* (2013.01); *H01L 2224/48091* (2013.01); *H01L 2224/48106* (2013.01); *H01L 2224/48227* (2013.01); *H01L 2224/48624* (2013.01); *H01L 2224/48824* (2013.01); *H01L 2224/73265* (2013.01); *H01L 2924/00014* (2013.01); *H01L 2924/01022* (2013.01); *H01L 2924/01028* (2013.01); *H01L 2924/01047* (2013.01); *H01L 2924/01073* (2013.01); *H01L 2924/01074* (2013.01); *H01L 2924/01079* (2013.01); *H01L 2924/04941* (2013.01); *H01L 2924/04953* (2013.01); *H01L 2924/05432* (2013.01); *H01L 2924/15724* (2013.01); *H01L 2924/15747* (2013.01)

(58) Field of Classification Search
USPC .......................................... 174/257; 257/676
See application file for complete search history.

(56) References Cited

U.S. PATENT DOCUMENTS

| | | | | |
|---|---|---|---|---|
| 7,939,935 | B2* | 5/2011 | Chinda | H01L 21/4853 257/700 |
| 8,164,004 | B2 | 4/2012 | Chen et al. | |
| 8,256,112 | B2 | 9/2012 | Kang | |
| 8,853,077 | B2* | 10/2014 | Li | H01L 21/768 257/774 |
| 8,987,910 | B2 | 3/2015 | Ozkok et al. | |
| 9,035,197 | B2* | 5/2015 | Ao | H05K 1/115 174/262 |
| 2001/0042897 | A1* | 11/2001 | Yeh | H01L 23/5256 257/529 |
| 2004/0183197 | A1* | 9/2004 | Matsuoka | H01L 24/48 257/758 |
| 2007/0037378 | A1* | 2/2007 | Joo | H01L 21/76849 438/614 |
| 2007/0187833 | A1* | 8/2007 | Hashimoto | H01L 21/02063 257/762 |
| 2007/0187883 | A1* | 8/2007 | Tokashiki | B42C 19/02 270/1.01 |
| 2007/0194460 | A1* | 8/2007 | Lee | H01L 24/05 257/781 |
| 2007/0268675 | A1* | 11/2007 | Chinda | H01L 21/4853 361/748 |
| 2009/0133920 | A1 | 5/2009 | Kim et al. | |
| 2010/0184285 | A1* | 7/2010 | Hua | H01L 24/03 438/612 |
| 2010/0239857 | A1 | 9/2010 | Tarng et al. | |
| 2012/0175772 | A1 | 7/2012 | Leung et al. | |
| 2012/0267768 | A1* | 10/2012 | Andry | H01L 23/556 257/660 |
| 2013/0122216 | A1 | 5/2013 | Tarng et al. | |
| 2014/0144682 | A1 | 5/2014 | Orlowski et al. | |
| 2015/0380376 | A1* | 12/2015 | Mathew | H01L 24/49 257/676 |
| 2016/0329275 | A1 | 11/2016 | Park et al. | |

FOREIGN PATENT DOCUMENTS

| | | |
|---|---|---|
| KR | 2000/0044851 A | 7/2000 |
| KR | 10-0674321 B1 | 1/2007 |
| KR | 2007/0024865 A | 3/2007 |
| KR | 10-0877095 B1 | 1/2009 |
| KR | 2009/0010654 A | 1/2009 |
| KR | 2009/0053628 A | 5/2009 |
| KR | 10-1317184 B1 | 10/2013 |
| KR | 2014/0001550 A | 1/2014 |
| KR | 2014/0076811 A | 6/2014 |
| KR | 2014/0078197 A | 6/2014 |
| KR | 2016/0132229 A | 11/2016 |

* cited by examiner

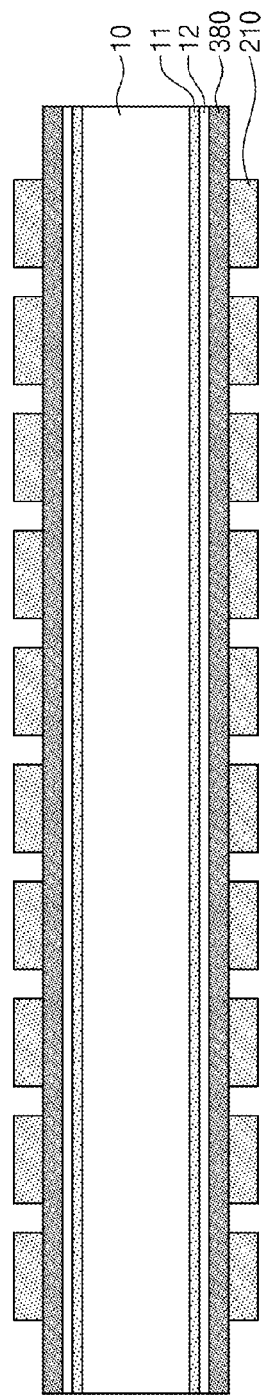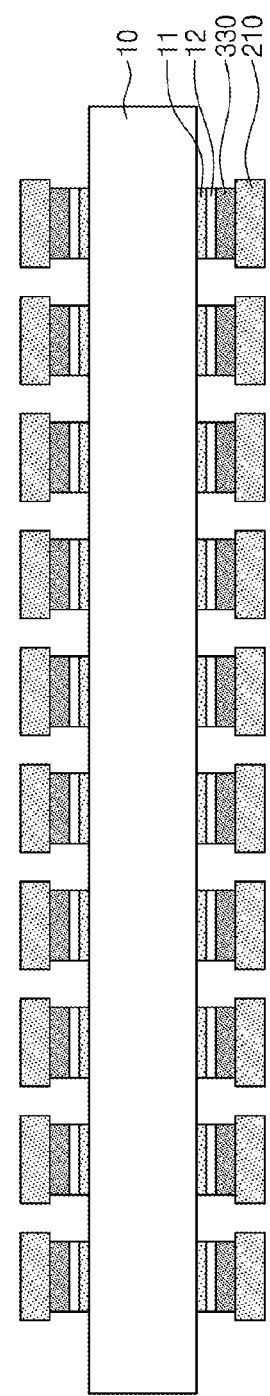

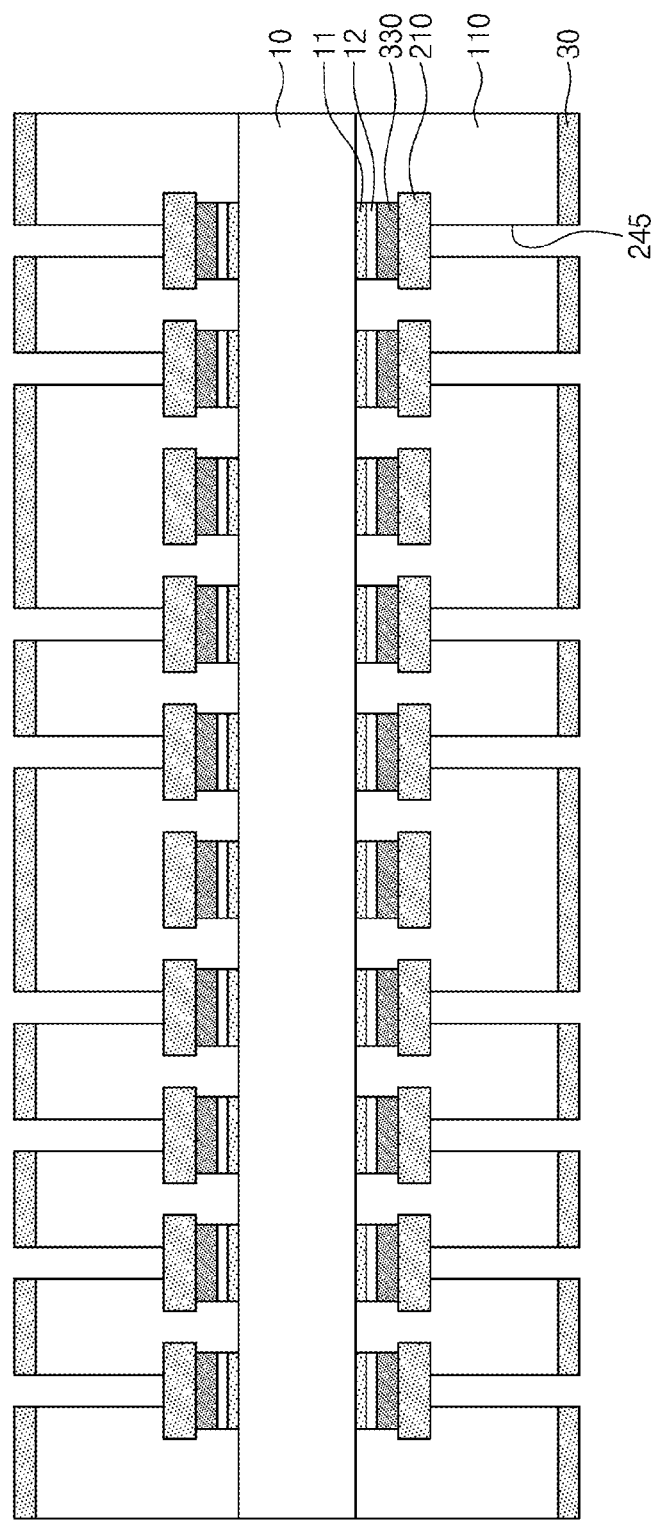

PACKAGE SUBSTRATE, METHOD FOR FABRICATING THE SAME, AND PACKAGE DEVICE INCLUDING THE PACKAGE SUBSTRATE

CROSS-REFERENCE TO RELATED APPLICATION

This U.S. non-provisional patent application claims priority under 35 U.S.C. § 119 to Korean Patent Application No. 10-2016-0001002, filed on Jan. 5, 2016, in the Korean Intellectual Property Office, the disclosure of which is hereby incorporated by reference in its entirety.

BACKGROUND

Example embodiments of the inventive concepts relate to package substrates and, more particularly, to package substrates including an embedded aluminum pad to which a surface treatment process is performed, methods for fabricating the same, and package devices including the package substrate.

Various techniques of treating a surface of a printed circuit board (PCB) have been developed as a density of electronic components increases. For example, metal plating techniques are used to treat the surface of the PCB. The metal plating techniques may include a chemical deposition technique, a metal sputtering technique, an electroplating technique, and an electroless metal plating technique. To cope with a demand for thin-plated and high-density PCBs, surfaces of PCBs have been plated or electroless-treated to simplify processes of fabricating PCBs and to mitigate or remove noise from the PCBs.

Further, researches of reducing thicknesses of PCBs have been conducted as the density of electronic components increases. An insulating layer and a pattern may be formed on a coreless PCB to fabricate a thin PCB, and the thin PCB may be applied to small electronic components. Furthermore, researches have been conducted to reduce pitches in the PCBs. A total area of a PCB may be reduced by the pitch reduction. Thus, researches are being conducted for various processes such as a tenting process, a semi additive process (SAP), and a modified additive process (MSAP).

SUMMARY

Some example embodiments of the inventive concepts may provide package substrates including an embedded aluminum pad inserted in an insulating layer.

Some example embodiments of the inventive concepts may also provide methods for fabricating a package substrate including an aluminum pad not protruding outside the package substrate.

According to an example embodiment, a package substrate may include an insulating layer having a top surface and a bottom surface opposite to the top surface, at least one first copper pattern in the insulating layer, the at least one first copper pattern adjacent to the top surface of the insulating layer, at least second copper pattern on the bottom surface of the insulating layer, and at least one embedded aluminum pad on the at least one first copper pattern, the at least one embedded aluminum pad in the insulating layer such that a top surface of the at least one embedded aluminum pad is exposed by the insulating layer.

According to an example embodiment, a package substrate may include an insulating layer having a top surface and a bottom surface opposite to the top surface, at least one first copper pattern provided in the insulating layer, the at least one first copper pattern adjacent to the top surface of the insulating layer, at least one second copper pattern provided in the insulating layer, the at least one second copper pattern adjacent to the bottom surface of the insulating layer, at least one first embedded aluminum pad on the first copper pattern, the at least one first embedded aluminum pad in the insulating layer, a top surface of the at least one first embedded aluminum exposed by the insulating layer, and at least one second embedded aluminum pad on the second copper pattern, the at least one second embedded aluminum pad in the insulating layer, a bottom surface of the at least one second embedded aluminum pad exposed by the insulating layer.

According to an example embodiment, a package device may include a package substrate including at least one embedded aluminum pad, the package substrate including an insulating layer having a top surface and a bottom surface opposite to the top surface, at least one first copper pattern in the insulating layer, the first copper pattern adjacent to the top surface of the insulating layer, and at least one second copper pattern on the bottom surface of the insulating layer, the at least one embedded aluminum pad on the first copper pattern, the at least one embedded aluminum pad in the insulating layer, and a top surface of the at least one embedded aluminum pad exposed by the insulating layer, and a semiconductor chip disposed on the package substrate and connected to the package substrate through a bonding wire.

According to an example embodiment, a package substrate may include an insulating layer including via holes, conductive vias filling the via holes, a plurality of first metal patterns in the insulating layer, the plurality of first metal pattern adjacent to a top surface of the insulating layer, the plurality of first metal pattern predominantly including copper, a plurality of second metal patterns in the insulating layer, the plurality of second metal patterns adjacent to a bottom surface of the insulating layer, the plurality of second metal pattern predominantly including copper, and at least one first embedded metal pad on at least one of the plurality of first metal patterns, the at least one first embedded metal pad in the insulating layer such that a top surface of the at least one first embedded metal pad is exposed by the insulating layer, the at least one first embedded metal pad predominantly including aluminum

BRIEF DESCRIPTION OF THE DRAWINGS

The inventive concepts will become more apparent in view of the attached drawings and accompanying detailed description.

FIGS. 6A to 6F are cross-sectional views illustrating a method for fabricating the package substrate of FIG. 5.

DETAILED DESCRIPTION

Figure 1:
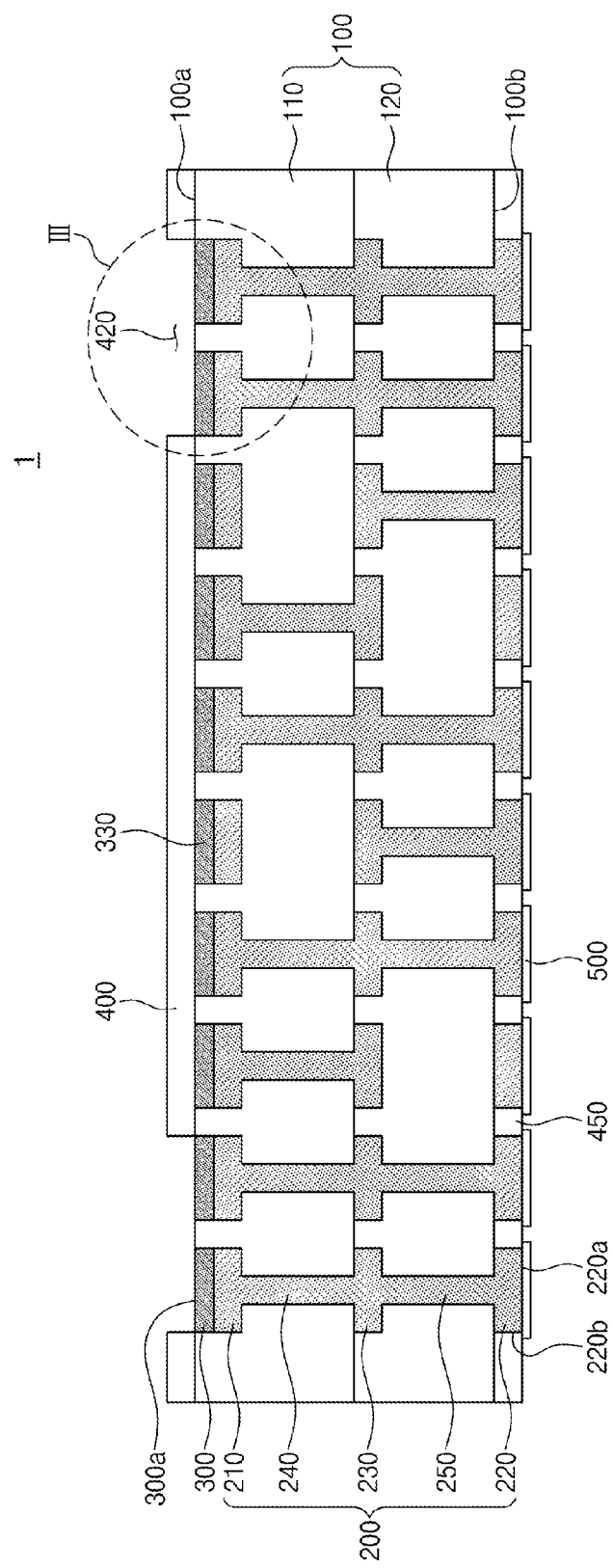
FIG. 1 is a cross-sectional view illustrating a package substrate according to some example embodiments of the inventive concepts.

FIG. 1 is a cross-sectional view illustrating a package substrate according to some example embodiments of the inventive concepts.

Referring to FIG. 1, a package substrate 1 may include an insulating layer 100, interconnection patterns 200, at least one embedded aluminum pad 300, and protection layers 400 and 450.

The insulating layer 100 may have a top surface 100a and a bottom surface 100b opposite to the top surface 100a. The insulating layer 100 may include a first insulating layer 110 and a second insulating layer 120. The first insulating layer 110 and the second insulating layer 120 may be prepreg. The first insulating layer 110 may be disposed on the second insulating layer 120.

The interconnection patterns 200 may be disposed in the insulating layer 100. The interconnection pattern 200 may include a first copper pattern 210, a second copper pattern 220, a third copper pattern 230, a first via 240, and a second via 250. The first copper pattern 210 may be disposed in the first insulating layer 110 and may be adjacent to the top surface 100a of the insulating layer 100. The second copper pattern 220 may be disposed on the second insulating layer 120 (e.g., on the bottom surface 100b of the insulating layer 100). The second copper pattern 220 may have a bottom surface 220a and a sidewall 220b. The third copper pattern 230 may be disposed in the second insulating layer 120 and may be disposed between the first copper pattern 210 and the second copper pattern 220. The first via 240 may connect at least one first copper pattern 210 to at least one third copper pattern 230. The second via 250 may connect at least one second copper pattern 220 to at least one third copper pattern 230. For example, the first via 240 and the second via 250 may include copper (Cu). However, example embodiments of the inventive concepts are not limited to a specific arrangement of the interconnection patterns 200.

The embedded aluminum pad 300 may be disposed on the first copper pattern 210 and may be in contact with the first copper pattern 210. The embedded aluminum pad 300 may be provided in plurality in each of both edge portions of the first insulating layer 110. The plurality of embedded aluminum pads 300 disposed in one edge portion of the first insulating layer 110 may be spaced apart from each other, and the plurality of embedded aluminum pads 300 disposed in another edge portion of the first insulating layer 300 may be spaced apart from each other. The embedded aluminum pad 300 may be inserted in the first insulating layer 110 and may not protrude outside the first insulating layer 110. The embedded aluminum pad 300 may have a top surface 300a exposed by the insulating layer 100. In some example embodiments, the top surface 300a of the embedded aluminum pad 300 may be disposed at the same level as the top surface 100a of the insulating layer 100.

The protection layers 400 and 450 may include a first protection layer 400 disposed on the top surface 100a of the insulating layer 100 and a second protection layer 450 disposed on the bottom surface 100b of the insulating layer 100. The first protection layer 400 may have openings 420 exposing the embedded aluminum pads 300 disposed in the both edge portions of the first insulating layer 110. As described above, the second protection layer 450 may be disposed on the bottom surface 100b of the insulating layer 100. The second protection layer 450 may cover the sidewall 220b of the second copper pattern 220 and may expose the bottom surface 220a of the second copper pattern 220. The first protection layer 400 may protect the first copper patterns 210 and may mitigate or prevent a bridge phenomenon from occurring between the first copper patterns 210 adjacent to each other. The second protection layer 450 may protect the second copper patterns 220 and may mitigate or prevent a bridge phenomenon from occurring between the second copper patterns 220 adjacent to each other. Each of the first and second protection layers 400 and 450 may be an insulating coating layer. For example, the insulating coating layer may include epoxy resin.

A coating layer 500 may cover the bottom surface 220a of the second copper pattern 220 and may cover a portion of the second protection layer 450. The coating layer 500 may mitigate or prevent oxidation of the second copper pattern 220. For example, the coating layer 500 may include an organic compound including one of a chloride or a fluoride.

According to some example embodiments of the inventive concepts, the embedded aluminum pad 300 may not protrude outside the first insulating layer 110 but may be disposed in the first insulating layer 110. In general, a package substrate may have a pad protruding outward. A distance between the embedded aluminum pads 300 according to the inventive concepts may be greater than a distance between general pads. Thus, the embedded aluminum pads 300 may not be in contact with each other, and reliability may be improved in a wire bonding process of the package substrate 1.

According to some example embodiments of the inventive concepts, a surface finishing process may be performed using aluminum (Al) as a pad. Aluminum (Al) may have a desirable electrical conductivity and may be inexpensive. Thus, aluminum (Al) may be substituted for gold (Au) in an electroless nickel/immersion gold (ENIG) process. Thus, a fabrication cost of the package substrate 1 may be substantially reduced.

FIGS. 2A to 2J are cross-sectional views illustrating a method for fabricating the package substrate of FIG. 1.

Figure 2A:
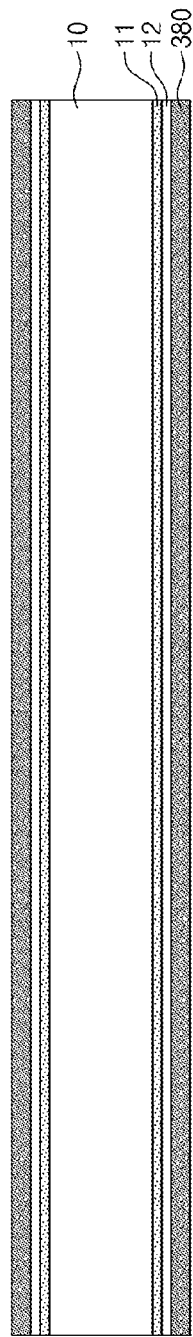
FIGS. 2A to 2J are cross-sectional views illustrating a method for fabricating the package substrate of FIG. 1.

Referring to FIG. 2A, a carrier substrate 10 may be provided. A copper foil 11 and a release layer 12 may be sequentially stacked on each of both surfaces (e.g., top and bottom surfaces) of the carrier substrate 10. An aluminum seed layer 380 may be provided on the release layers 12 of the carrier substrate 10. Thin barrier metals such as copper may be placed between the release layers 12 and the aluminum seed layer 380 for mitigating IMC formation and selective etching. The carrier substrate 10 may have a structure in which a plurality of insulating material layers may be stacked. Each of the insulating material layers may include resin or glass fiber. The release layer 12 may include an alloy or an organic compound. The aluminum seed layer 380 may be formed by, for example, a deposition process or a plating process. Thin seed Cu may be deposited or plated on the aluminum seed layer 380 for improved plating.

Figure 2B:
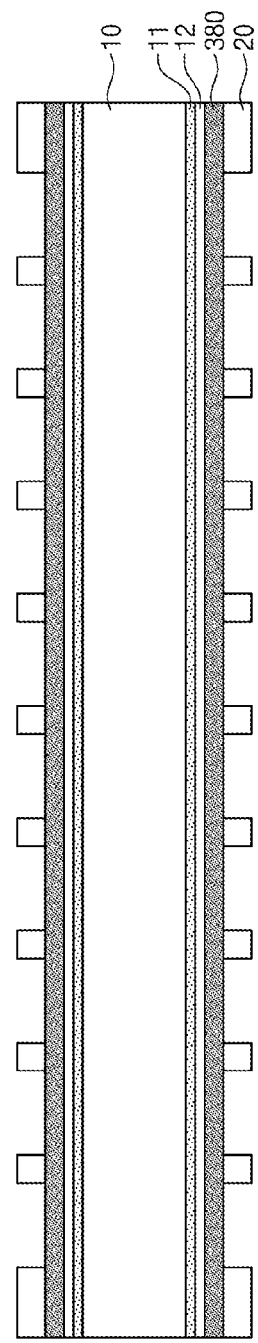

Referring to FIG. 2B, a mask pattern 20 exposing one or more portions of the aluminum seed layer 380 may be provided on each of the aluminum seed layers 380. Subsequent processes will be performed on the both surfaces (e.g., the top surface and bottom surface) of the carrier substrate 10 in symmetry with respect to the carrier substrate 10.

Figure 2C:
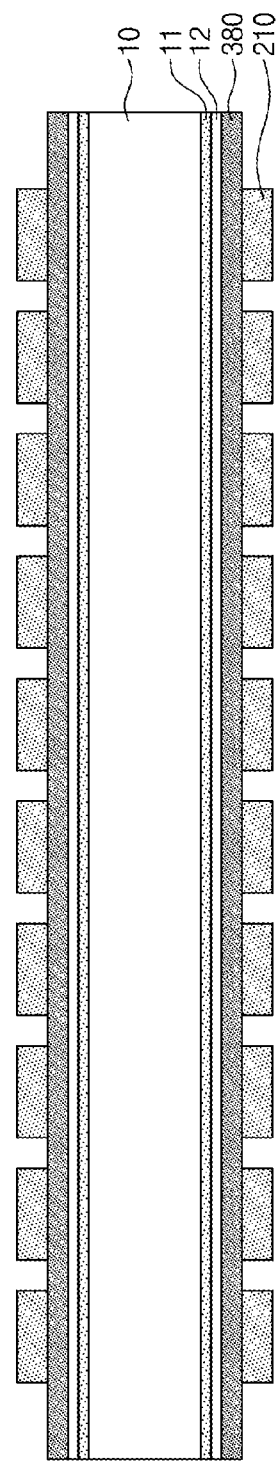

Referring to FIG. 2C, one or more first copper patterns 210 may be formed using the mask pattern 20 on the aluminum seed layer 380. The first copper pattern 210 may be formed on the aluminum seed layer 380 on each of the both surfaces of the carrier substrate 10. The first copper pattern 210 may be formed by a plating process.

Figure 2D:
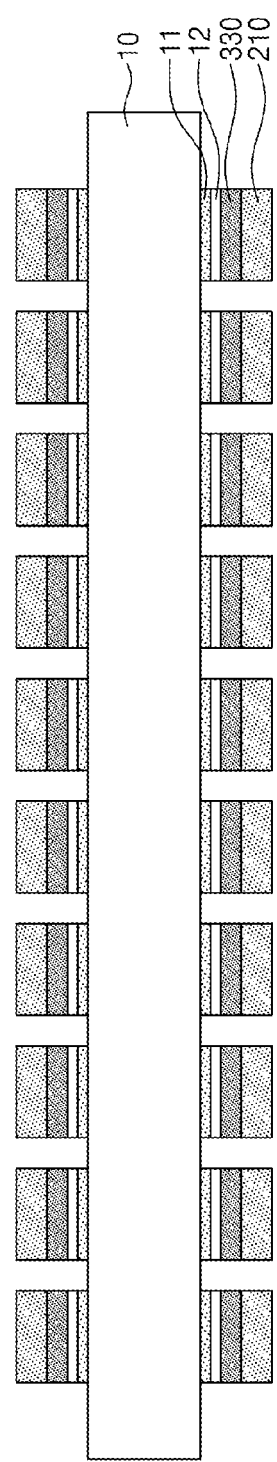

Referring to FIG. 2D, the aluminum seed layer 380 may be etched using the first copper pattern 210 as an etch mask to form a preliminary aluminum pad 330. An etching solution used in the etching process may include a material that does not react with copper (Cu) but reacts with aluminum (Al). For example, the etching solution may include an alkaline etching solution including sodium hydroxide (NaOH), or an acid etching solution in which an organic acid is mixed with phosphoric acid ($H_3PO_4$) and sulfuric acid ($H_2SO_4$). A width of the preliminary aluminum pad 330 formed by the etching process may be similar to a width of the first copper pattern 210. The copper foil 11 and the release layer 12 may also be patterned by the etching process. Even though the copper foil 11 is formed of copper, a portion of the copper foil 11 may be removed by the etching process because the copper foil 11 has a very thin thickness.

Figure 2E:
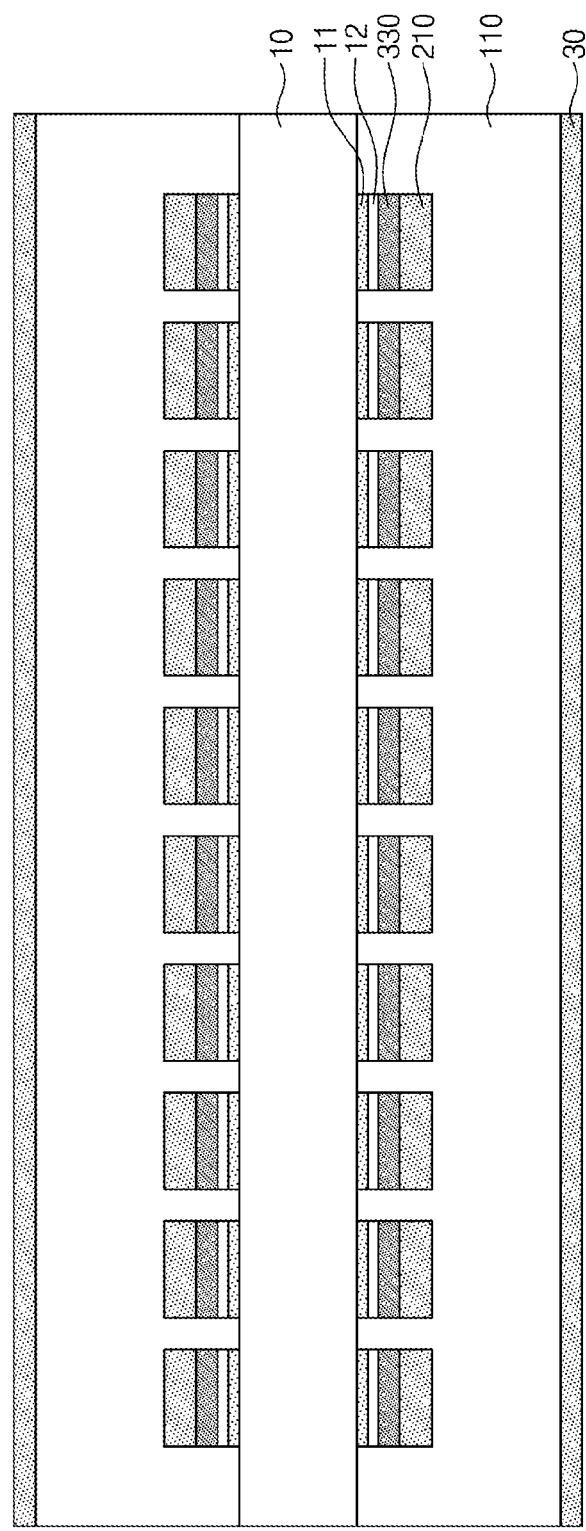

Referring to FIG. 2E, a first insulating layer 110 may be formed to cover the first copper pattern 210 and the preliminary aluminum pad 330. As illustrated in FIG. 2E, the first insulating layer 110 may be formed on each of the both surfaces of the carrier substrate 10. The first insulating layer 110 may be in contact with the release layer 12 on one surface of the first insulating layer 110, and a metal layer 30 may be provided on another surface of the first insulating layer 110. The first insulating layer 110 may be prepreg.

Figure 2F:
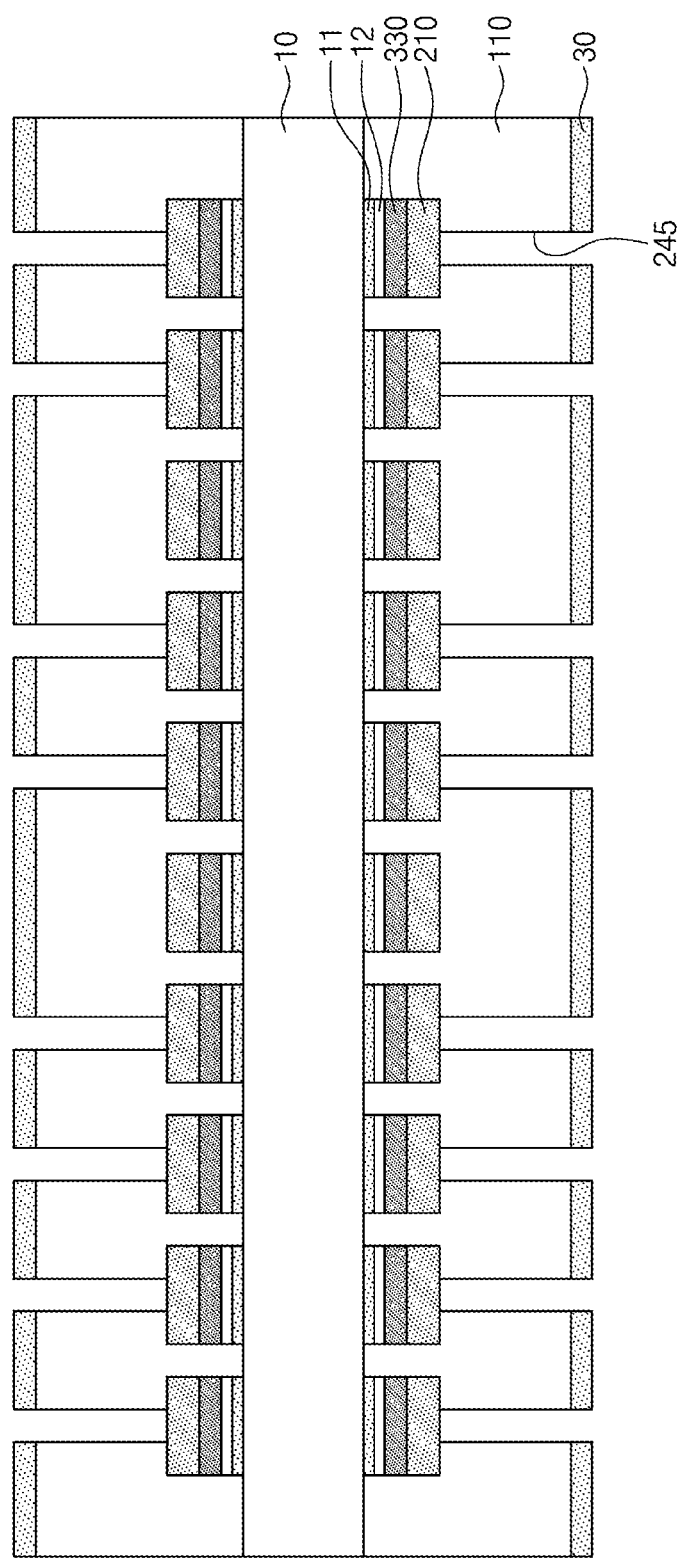

Referring to FIG. 2F, a first via-hole 245 may be formed to expose the first copper pattern 210. The first via-hole 245 may penetrate a portion of the first insulating layer 110, which is disposed between the metal layer 30 and the first copper pattern 210. Further, the first via-hole 245 may also penetrate the metal layer 30 overlapping with the first copper pattern 210. The first via-hole 245 may be formed by a laser drilling process.

Figure 2G:
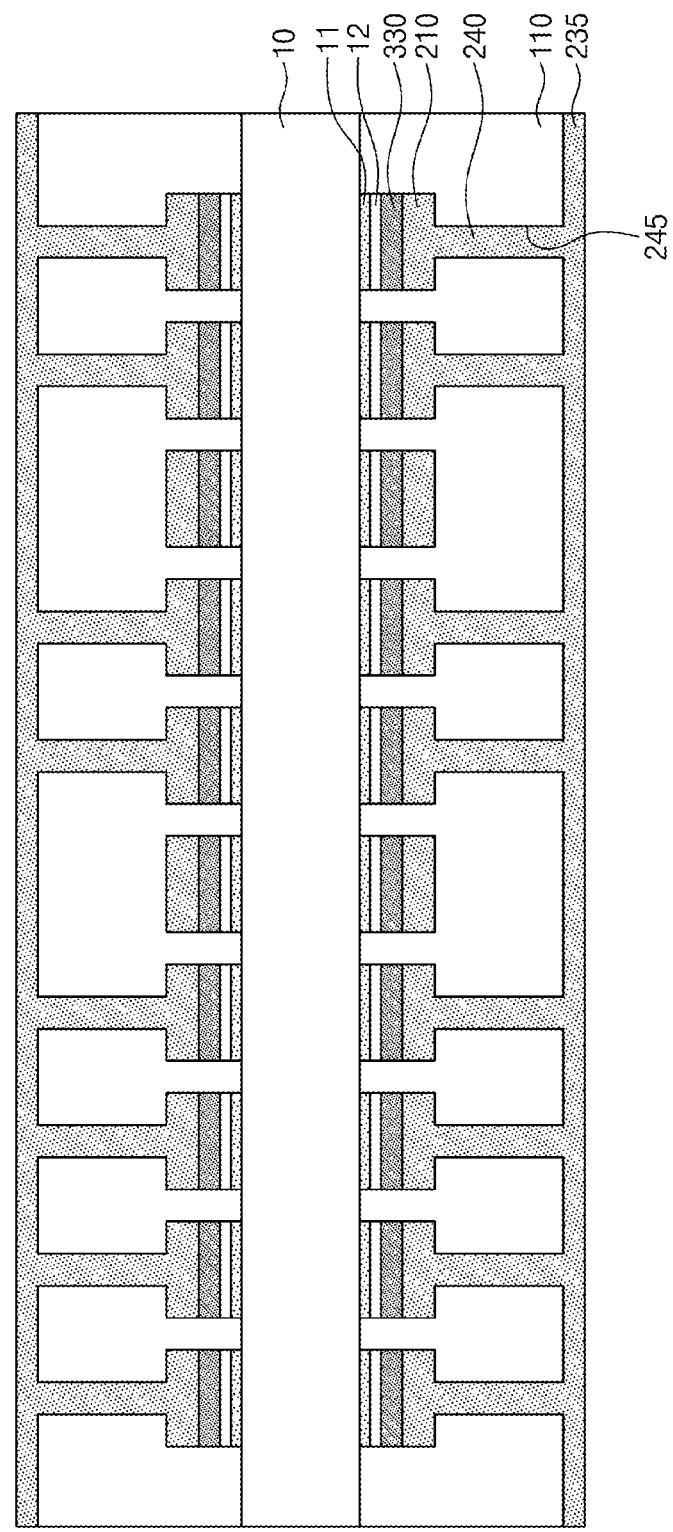

Referring to FIG. 2G, a plating process may be performed to form a first via 240 and a third preliminary copper pattern 235. The first via 240 may fill the first via-hole 245. The third preliminary copper pattern 235 may be formed on the first insulating layer 110. The first via 240 and the third preliminary copper pattern 235 may be plated with the same metal material. For example, the metal material may be copper (Cu).

Figure 2H:
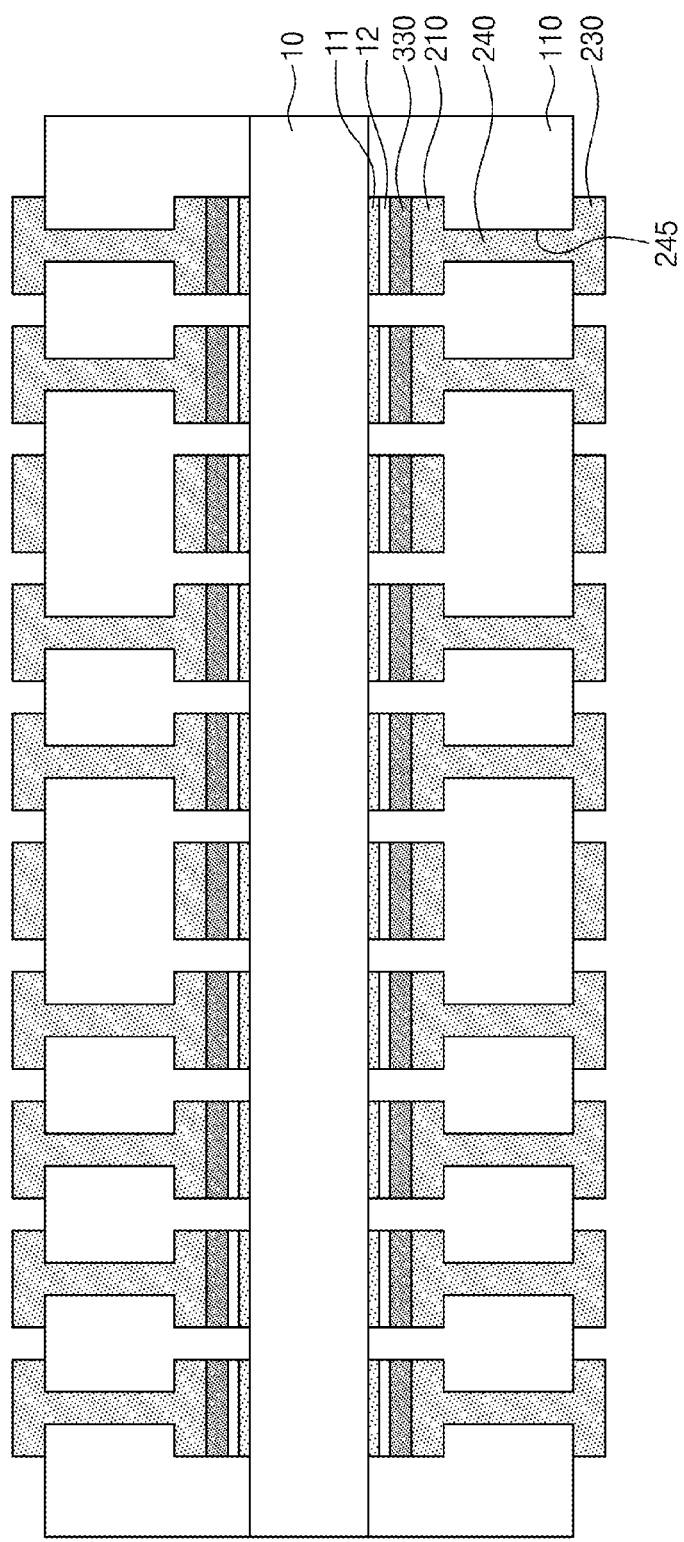

Referring to FIG. 2H, the third preliminary copper pattern 235 may be etched to form a third copper pattern 230. An etching solution used in the etching process may include a mixed solution of ammonium hydroxide and hydrogen peroxide or a mixed solution of hydrogen peroxide and sulfuric acid. A plurality of the third copper patterns 230 may be spaced apart from each other on the first insulating layer 110.

Figure 2I:
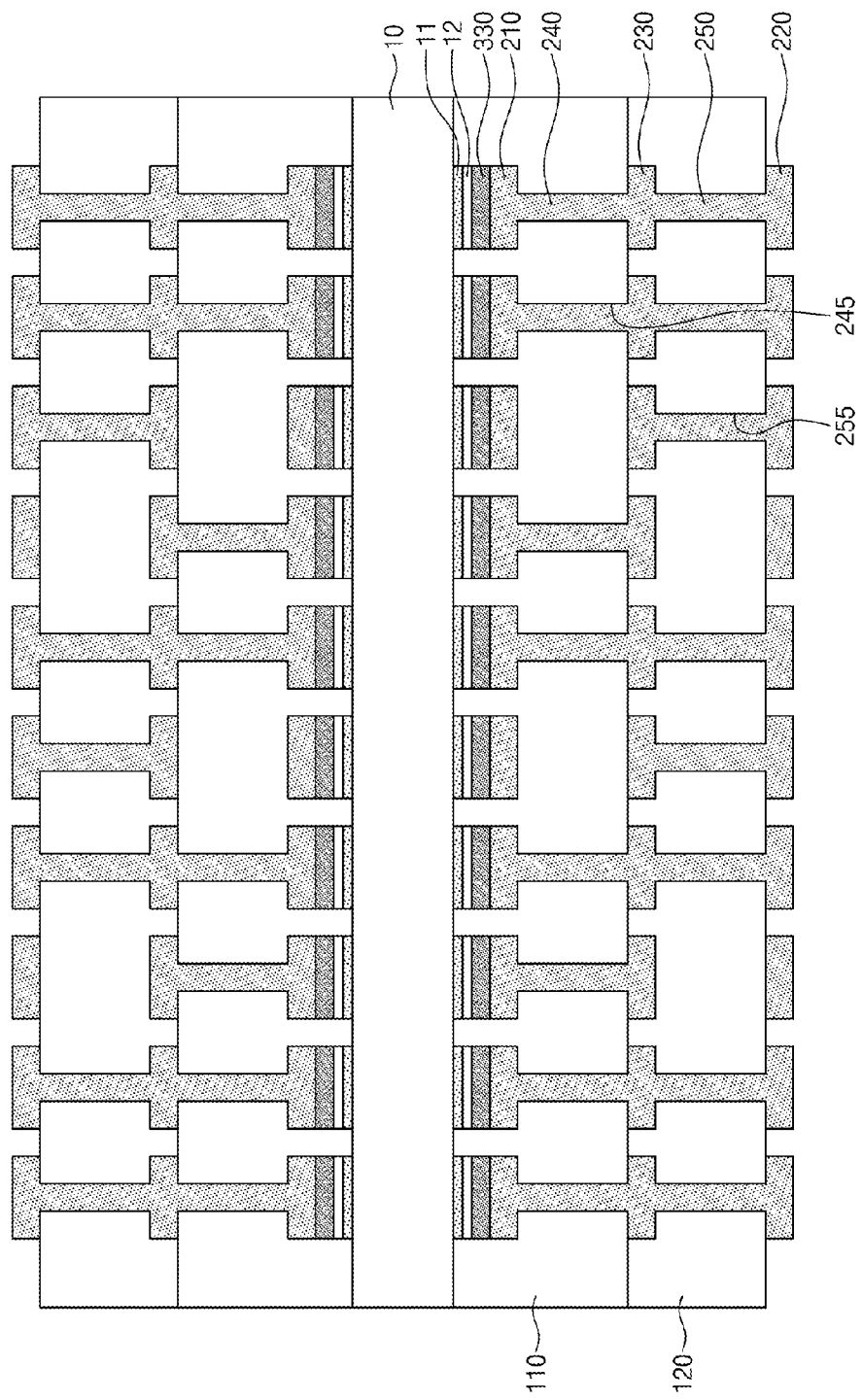

Referring to FIG. 2I, a second insulating layer 120, a second copper pattern 220, and a second via 250 may be formed. Further, the second insulating layer 120 may cover the third copper pattern 230 and may be in contact with the first insulating layer 110. The second insulating layer 120 may be prepreg. Similarly to FIG. 2G, a second via-hole 255 exposing the third copper pattern 230 may be formed to penetrate a portion of the second insulating layer 120. The second via-hole 255 may be formed by a laser drilling process. A plating process may be performed to form the second via 250 filling the second via-hole 255 and the second copper pattern 220 disposed on the second insulating layer 120. The second via 250 may connect the second copper pattern 220 to the third copper pattern 230. The first copper pattern 210, the second copper pattern 220, the third copper pattern 230, the first via 240, and the second via 250 may be formed of the same metal material. For example, the metal material may be copper (Cu). The second copper pattern 220 may be formed in plurality, and the plurality of second copper patterns 220 may be spaced apart from each other on the second insulating layer 120.

Figure 2J:
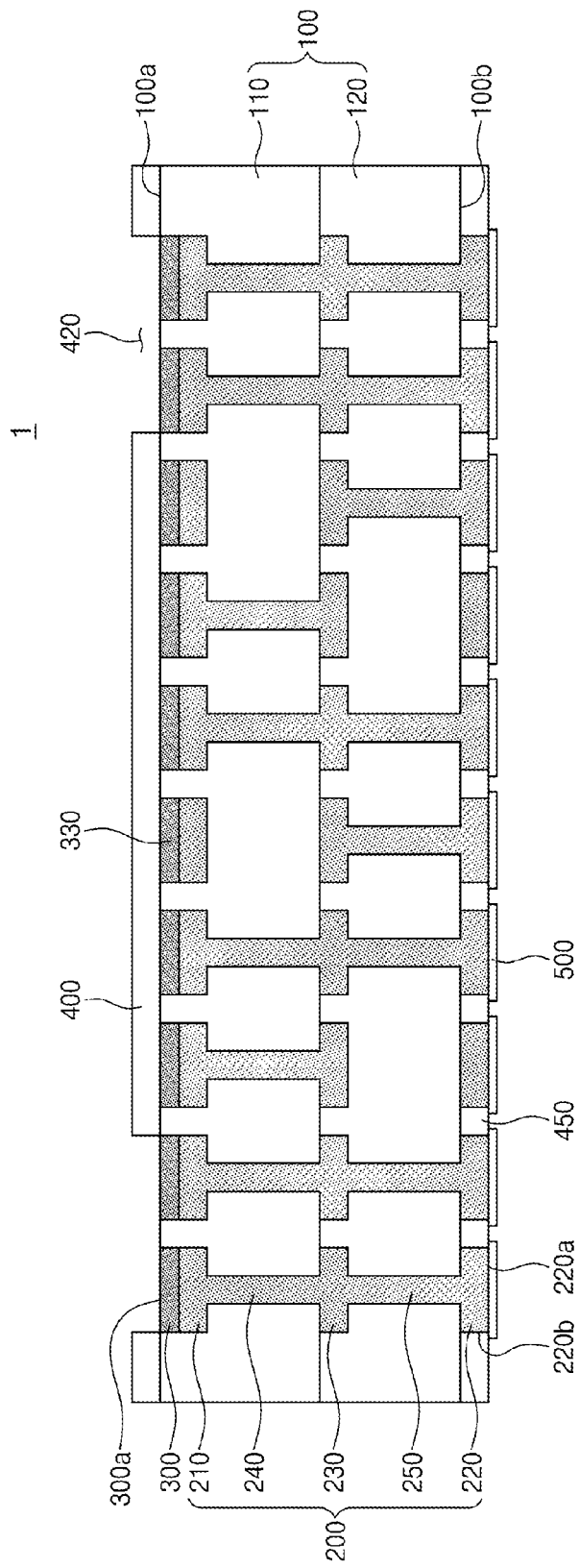

Referring to FIG. 2J, the carrier substrate 10, the copper foil 11, and the release layer 12 may be removed. A first protection layer 400 may be formed on a top surface 100a of an insulating layer 100 including the first and second insulating layers 110 and 120, and a second protection layer 450 may be formed on a bottom surface 100b of the insulating layer 100. Because the release layer 12 is easily separated from the preliminary aluminum pads 330, the carrier substrate 10, the copper foil 11, and the release layer 12 may be easily removed.

The first protection layer 400 may be formed to cover the top surface 100a of the insulating layer 100. The first protection layer 400 may have openings 420 exposing top surfaces 300 of the preliminary aluminum pads 330 disposed at edges of the first insulating layer 110. The preliminary aluminum pad 330 exposed by the opening 420 and the first insulating layer 110 may be defined as an embedded aluminum pad 300. An unexposed preliminary aluminum pad 330 covered by the first protection layer 400 may not be removed. Because a thickness of the unexposed preliminary aluminum pad 330 is much smaller than that of the first copper pattern 210, the unexposed preliminary aluminum pad 330 may not influence electrical characteristics of a package substrate 1 even though it is not removed. For example, the thickness of the preliminary aluminum pad 330 may range from 0.1 μm to 1 μm. Further, because the first protection layer 400 is easily bonded to the preliminary aluminum pad 330, the first protection layer 400 may be easily fixed on the first insulating layer 110 by the preliminary aluminum pad 330.

The second protection layer 450 may expose a bottom surface 220a of the second copper pattern 220 and may cover a sidewall 220b of the second copper pattern 220 and the bottom surface 100b of the insulating layer 100. A coating layer 500 may be formed on the bottom surface 220a of the second copper pattern 220. For example, the coating layer 500 may include an organic compound including one of a chloride or a fluoride. Further, the coating layer 500 may be formed by a substitution reaction between the organic compound and a portion of the second copper pattern 200 or may be formed by a coating process using the organic compound. The coating layer 500 may be formed to fabricate the package substrate 1.

According to the present example embodiment, aluminum (Al) may be used as a seed layer of the plating process for forming the first copper pattern 210. The aluminum (Al) used as the seed layer may not be removed but may be used as the pad of the package substrate 1 in a subsequent process. Thus, the processes of fabricating the package substrate 1 may be simplified. Further, because an additional surface treatment process of the first copper pattern 210 is not needed, a fabrication cost of the package substrate 1 may be reduced.

Figure 3:
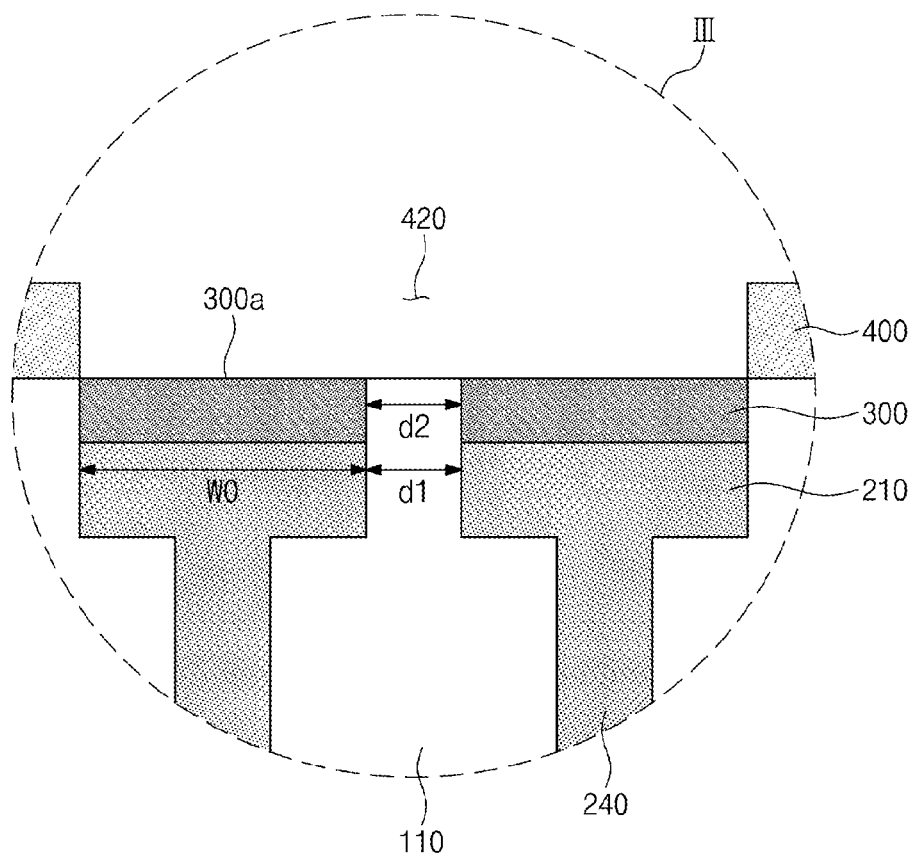
FIGS. 3 and 4 are enlarged cross-sectional views of a region 'III' of FIG. 1.
Figure 4:
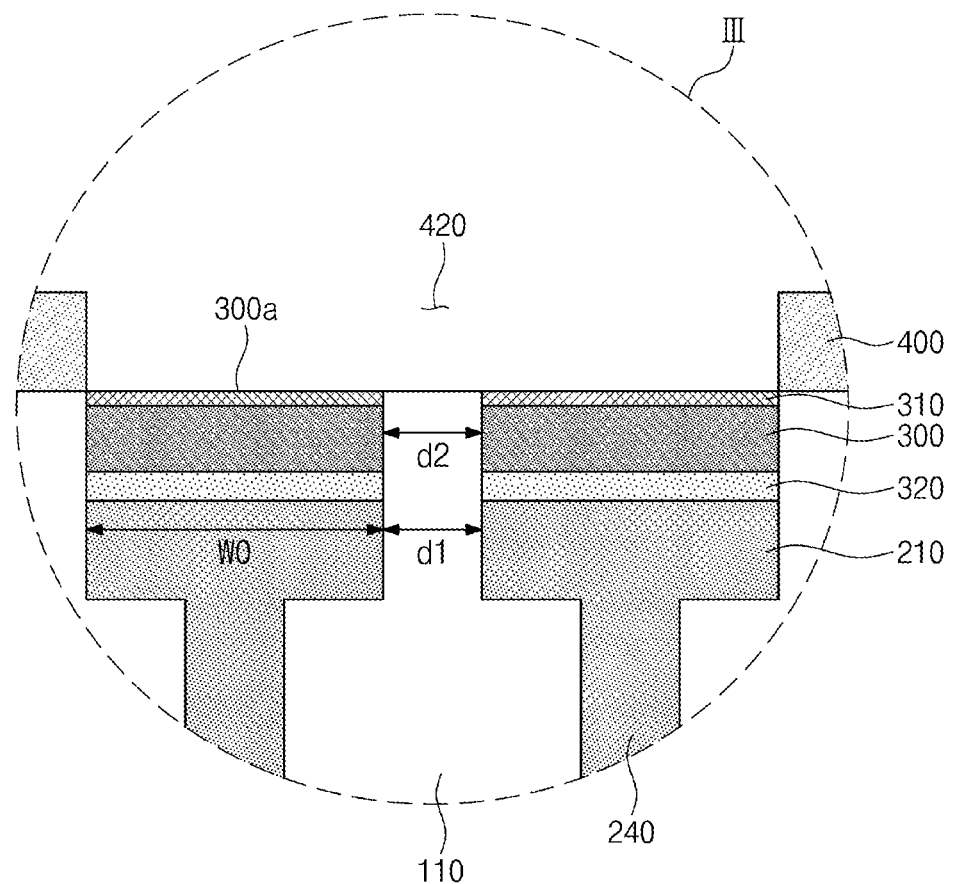

FIGS. 3 and 4 are enlarged cross-sectional views of a region 'III' of FIG. 1. Hereinafter, the descriptions to the same technical features as mentioned above will be omitted or mentioned briefly for ease and convenience of explanation.

Referring to FIGS. 1 and 3, the embedded aluminum pads 300 may be disposed on the first copper patterns 210, respectively. The embedded aluminum pad 300 may be provided in plurality in each of both edge portions of the first insulating layer 110. The first copper patterns 210 and the embedded aluminum pads 300 may have the same width W0. The first copper patterns 210 may be spaced apart from each other by a first distance d1. The embedded aluminum pads 300 may be spaced apart from each other by a second distance d2. The first distance d1 may be equal to the second distance d2.

Because the embedded aluminum pads 300 are inserted in the first insulating layer 110, the package substrate 1 may be fabricated such that the second distances d2 between the embedded aluminum pads 300 are uniform. Further, the distance between the embedded aluminum pads 300 according to the inventive concepts may be greater than a distance between pads protruding from an insulating layer in a general package substrate. Thus, reliability of a process of bonding a semiconductor chip to the package substrate 1 may be improved.

Referring to FIGS. 1 and 4, an aluminum oxide layer 310 may be provided on each of the embedded aluminum pads 300, and a barrier layer 320 may be disposed between each of the embedded aluminum pads 300 and a respective one of the first copper patterns 210. Because the embedded aluminum pads 300 come in contact with air, the aluminum oxide layers 310 may be naturally formed. The aluminum oxide layers 310 may mitigate or prevent additional oxidation and color change of the embedded aluminum pads 300. The aluminum oxide layer 310 may have a top surface 310a exposed outside the first insulating layer 110, and the top surface 310a of the aluminum oxide layer 310 may be disposed at the same level as the top surface 100a of the insulating layer 100. For example, the aluminum oxide layer 310 may be formed of alumina ($Al_2O_3$). The barrier layer 320 may mitigate or prevent copper (Cu) from being diffused from the first copper pattern 210 into the embedded aluminum pad 300. If copper (Cu) is diffused into the embedded aluminum pad 300, electrical conductivity of the embedded aluminum pad 300 may be reduced. According to the present example embodiment, the electrical conductivity of the embedded aluminum pads 300 may be maintained by the barrier layers 320. For example, the barrier layer 320 may include at least one of nickel (Ni), titanium (Ti), tantalum (Ta), titanium nitride (TiN), tantalum nitride (TaN), gold (Au), silver (Ag), or tungsten (W). In some example embodiments, the barrier layer 320 may include nickel (Ni).

The first copper patterns 210 may be spaced apart from each other by a first distance d1. The embedded aluminum pads 300 may be spaced apart from each other by a second distance d2, the aluminum oxide layers 310 may be spaced apart from each other by the second distance d2, and the barrier layers 320 may be spaced apart from each other by the second distance d2. The first distance d1 may be equal to the second distance d2.

Figure 5:
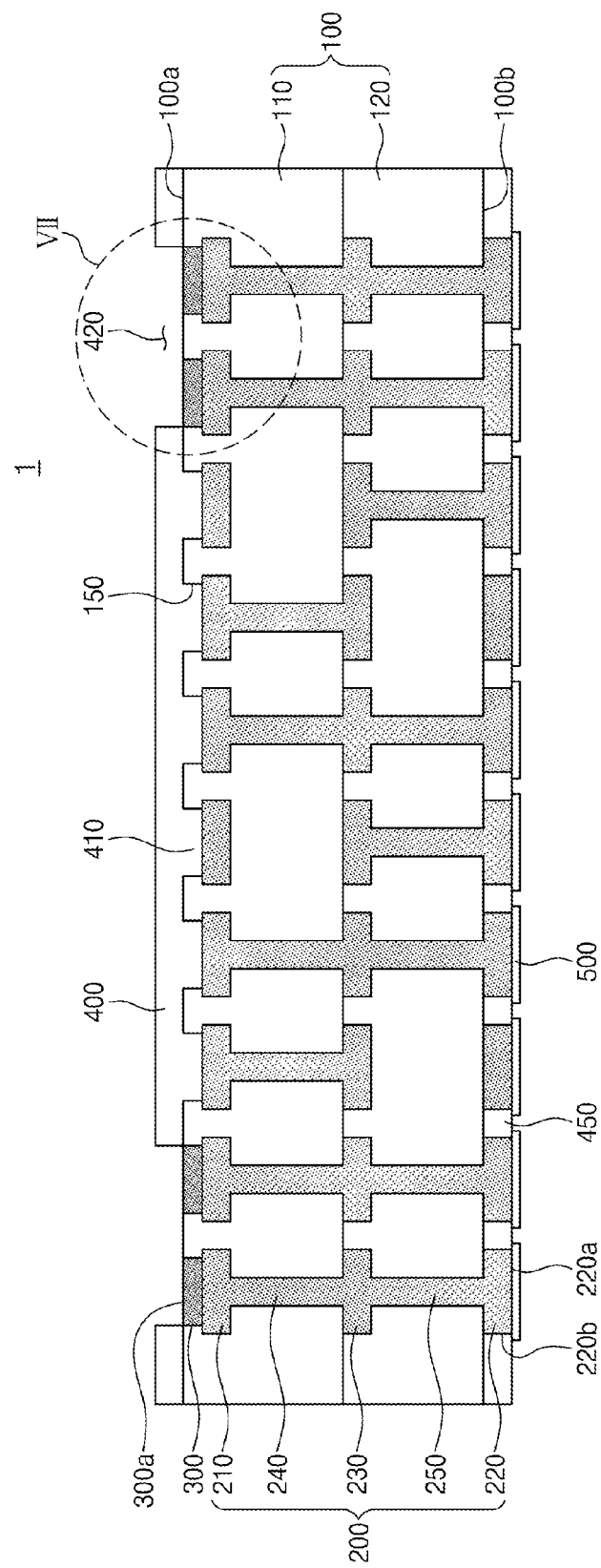
FIG. 5 is a cross-sectional view illustrating a package substrate according to some example embodiments of the inventive concepts.

FIG. 5 is a cross-sectional view illustrating a package substrate according to some example embodiments of the inventive concepts. Hereinafter, the descriptions to the same elements as in the example embodiment of FIG. 1 will be omitted or mentioned briefly for ease and convenience of explanation.

Referring to FIG. 5, a package substrate 1 may include an insulating layer 100, an interconnection pattern 200, an embedded aluminum pad 300, and protection layers 400 and 450.

The insulating layer 100 may include a first insulating layer 110 and a second insulating layer 120. The first insulating layer 110 may have a recess region 150 that is recessed in a direction from a top surface 100a of the insulating layer 100 toward a bottom surface 100b of the insulating layer 100. The recess region 150 may be provided in plurality.

The interconnection pattern 200 may be disposed in the insulating layer 100. The interconnection pattern 200 may include a first copper pattern 210, a second copper pattern 220, a third copper pattern 230, a first via 240, and a second via 250.

The embedded aluminum pad 300 may be disposed on the first copper pattern 210. A width of the embedded aluminum pad 300 may be smaller than a width of the first copper pattern 210. Likewise, a width of the recess region 150 may be smaller than the width of the first copper pattern 210.

The protection layers 400 and 450 may include a first protection layer 400 disposed on the top surface 100a of the insulating layer 100 and a second protection layer 450 disposed on the bottom surface 100b of the insulating layer 100. The first protection layer 400 may include at least one protrusion 410 that protrudes downward from top surface 100a of the insulating layer 100 toward the bottom surface 100b of the insulating layer 100 so as to be in contact with the first copper pattern 210 covered by the first protection layer 400. In other words, the protrusion 410 may be disposed in the recess region 150. A width of the protrusion 410 may be smaller than the width of the first copper pattern 210. The first protection layer 400 may have openings 420 exposing the embedded aluminum pads 300 disposed in the both edge portions of the first insulating layer 110. As described above, the second protection layer 450 may be disposed on the bottom surface 100b of the insulating layer 100. The second protection layer 450 may cover the sidewall 220b of the second copper pattern 220 and may expose the bottom surface 220a of the second copper pattern 220. The first protection layer 400 may protect the first copper patterns 210 and may mitigate or prevent a bridge phenomenon from occurring between adjacent ones of the first copper patterns 210. The second protection layer 450 may protect the second copper patterns 220 and may mitigate or prevent a bridge phenomenon from occurring between adjacent ones of the second copper patterns 220. Each of the first and second protection layers 400 and 450 may be an insulating coating layer. For example, the insulating coating layer may include epoxy resin.

FIGS. 6A to 6F are cross-sectional views illustrating a method for fabricating the package substrate of FIG. 5. In the present example embodiment, the descriptions to the same elements or technical features as in the example embodiment of FIGS. 2A to 2J will be omitted or mentioned briefly for ease and convenience of explanation.

Referring to FIG. 6A, a copper foil 11, a release layer 12, and an aluminum seed layer 380 may be provided on each of both surfaces of a carrier substrate 10. First copper patterns 210 may be formed on each of the aluminum seed layers 380 by a plating process.

Referring to FIG. 6B, preliminary aluminum pads 330 may be formed by an etching process. An etching solution used in the etching process may not react with copper (Cu) but may react with aluminum (Al). However, because the copper foil 11 has a very thin thickness, a portion of the copper foil 11 may be removed by the etching process. The preliminary aluminum pad 330 may be etched by the etching process such that a width of the preliminary aluminum pad 330 is smaller than a width of the first copper pattern 210.

Referring to FIG. 6C, a first insulating layer 110 may be formed to cover the first copper pattern 210 and the preliminary aluminum pad 330. The first insulating layer 110 may be drilled to form a first via-hole 245 exposing a portion of the first copper pattern 210.

Figure 6D:
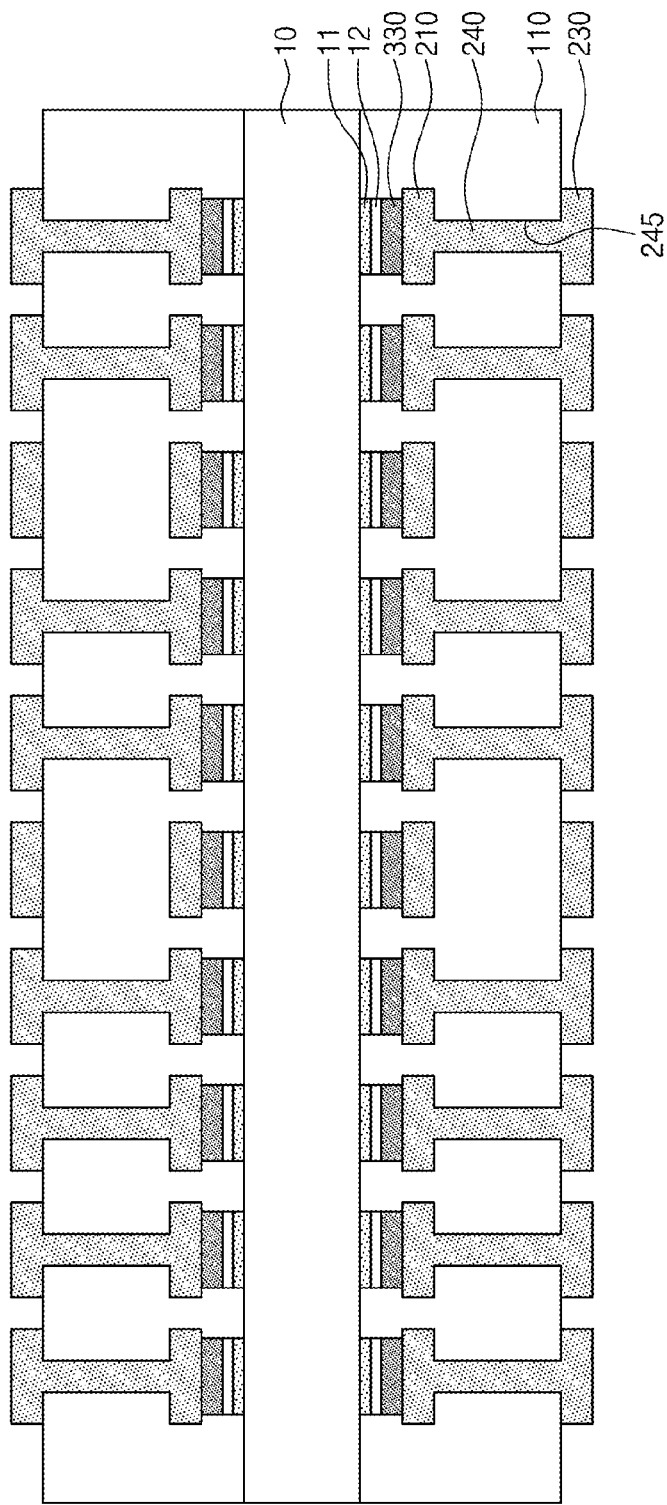

Referring to FIG. 6D, a plating process may be performed to form a first via 240 filling the first via-hole 245 and a third copper pattern 230 disposed on the first insulating layer 110.

Figure 6E:
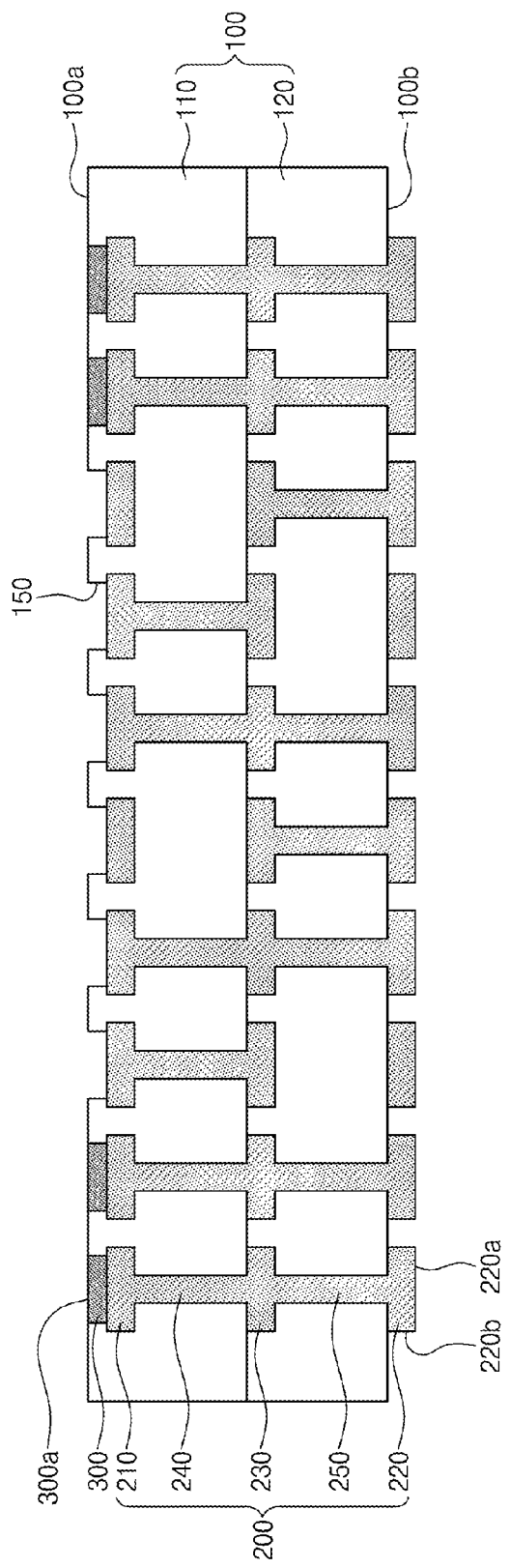

Referring to FIG. 6E, a second insulating layer 120, a second copper pattern 220, and a second via 250 may be formed. Thereafter, the carrier substrate 10, the copper foil 11, and the release layer 12 which are in contact with the first insulating layer 110 and the preliminary aluminum pads 330 may be removed, and one or some of the preliminary aluminum pads 330 may be removed. The one or some of the preliminary aluminum pads 330 may be removed by an etching process. An etching solution used in the etching process of removing the one or some preliminary aluminum pads 330 may include, for example, a mixed solution of ammonium hydroxide and hydrogen peroxide or a mixed solution of hydrogen peroxide and sulfuric acid. Spaces formed by the removal of the one or some preliminary aluminum pads 330 may be defined as recess regions 150. The recess region 150 may be recessed or depressed in a direction from the top surface 100a of the insulating layer 100 toward the bottom surface 100b of the insulating layer 100.

Figure 6F:
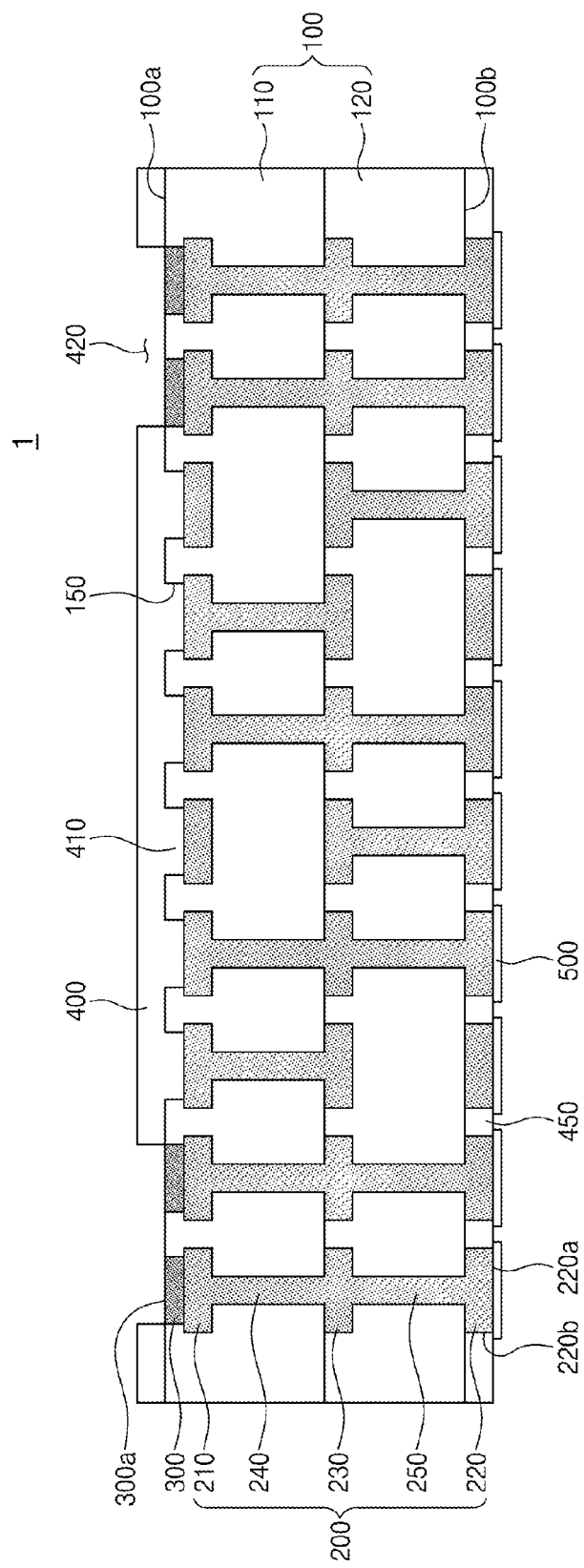

Referring to FIG. 6F, a first protection layer 400 may be formed on the top surface 100a of the insulating layer 100, and a second protection layer 450 may be formed on the bottom surface 100b of the insulating layer 100. The first protection layer 400 may be formed to cover the top surface 100a of the insulating layer 100 and the recess regions 150. The first protection layer 400 may have an opening 420 exposing at least one preliminary aluminum pad 330 that is not removed. The preliminary aluminum pad 330 exposed by the opening 420 may be defined as an embedded aluminum pad 300. The embedded aluminum pad 300 may be provided in plurality in each of both edge portions of the first insulating layer 110. The first protection layer 400 may be formed to cover the top surface 100a of the insulating layer 100, and the second protection layer 450 may be formed to cover the bottom surface 100b of the insulating layer 100. The first protection layer 400 may have at least one protrusion 410, and the protrusion 410 may fill the recess region 150.

Figure 7:
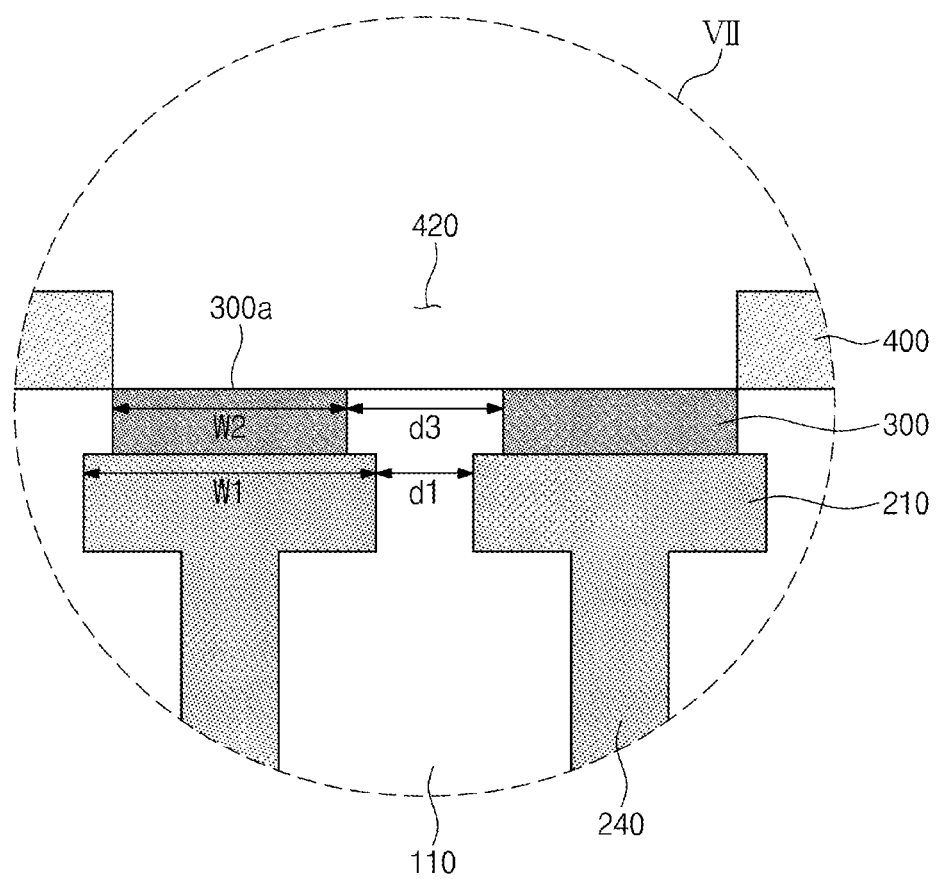
FIGS. 7 and 8 are enlarged cross-sectional views of a region 'VII' of FIG. 5.
Figure 8:
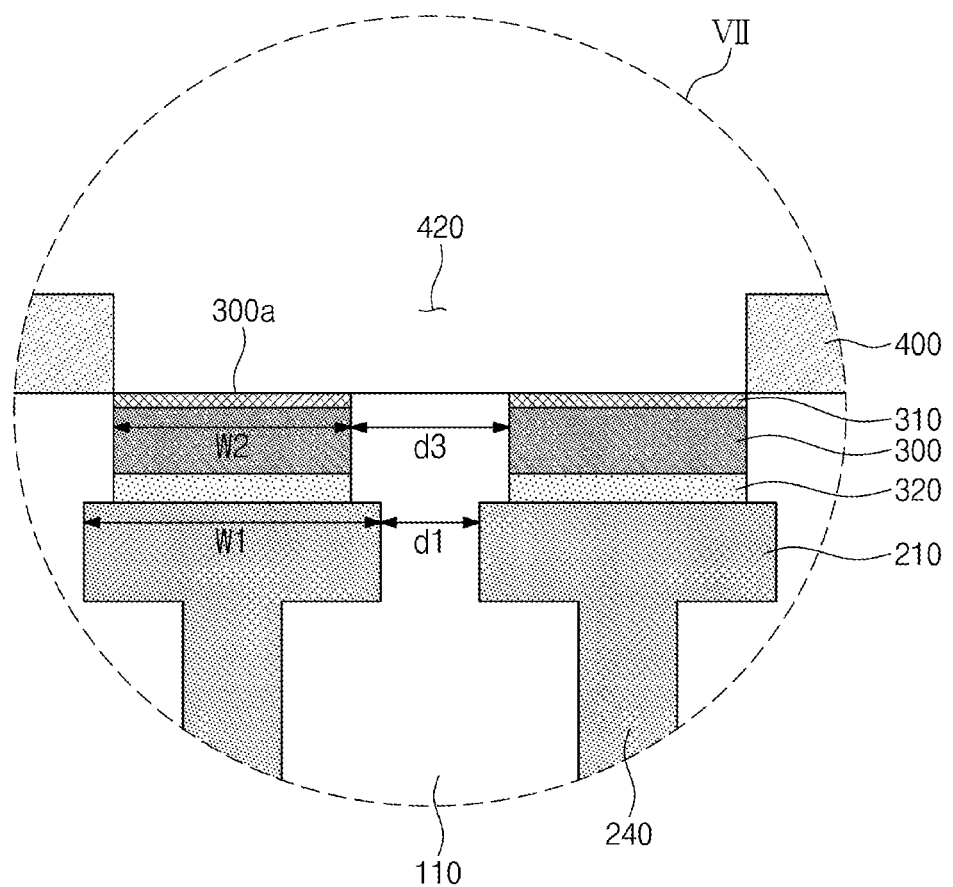

FIGS. 7 and 8 are enlarged cross-sectional views of a region 'VII' of FIG. 5.

Referring to FIGS. 5 and 7, the first copper pattern 210 may have a first width W1, and the embedded aluminum pad 300 may have a second width W2. The first copper pattern 210 may have a greater width than the embedded aluminum pad 300. In other words, the first width W1 may be greater than the second width W2.

The embedded aluminum pad 300 may be provided in plurality in each of both edge portions of the first insulating layer 100. The plurality of embedded aluminum pads 300 may be disposed on a plurality of the first copper patterns 210, respectively. The first copper patterns 210 may be spaced apart from each other by a first distance d1, and the embedded aluminum pads 300 may be spaced apart from each other by a third distance d3. The third distance d3 may be greater than the first distance d1.

Referring to FIGS. 5 and 8, an aluminum oxide layer 310 may be provided on each of the embedded aluminum pads 300, and a barrier layer 320 may be disposed between each of the first copper patterns 210 and a corresponding one of the embedded aluminum pads 300. The aluminum oxide layer 310 may have a top surface 310a exposed outside the first insulating layer 110, and the top surface 310a of the aluminum oxide layer 310 may be disposed at the same level as the top surface 100a of the insulating layer 100. For example, the aluminum oxide layer 310 may include alumina (Al$_2$O$_3$), and the barrier layer 320 may include at least one of nickel (Ni), titanium (Ti), tantalum (Ta), titanium nitride (TiN), tantalum nitride (TaN), gold (Au), silver (Ag), or tungsten (W). In some example embodiments, the barrier layer 320 may include nickel (Ni).

The first copper patterns 210 may be spaced apart from each other by a first distance d1. The embedded aluminum pads 300 may be spaced apart from each other by a third distance d3, the aluminum oxide layers 310 may be spaced apart from each other by the third distance d3, and the barrier layers 320 may be spaced apart from each other by the third distance d3. The third distance d3 may be greater than the first distance d1.

Figure 9:
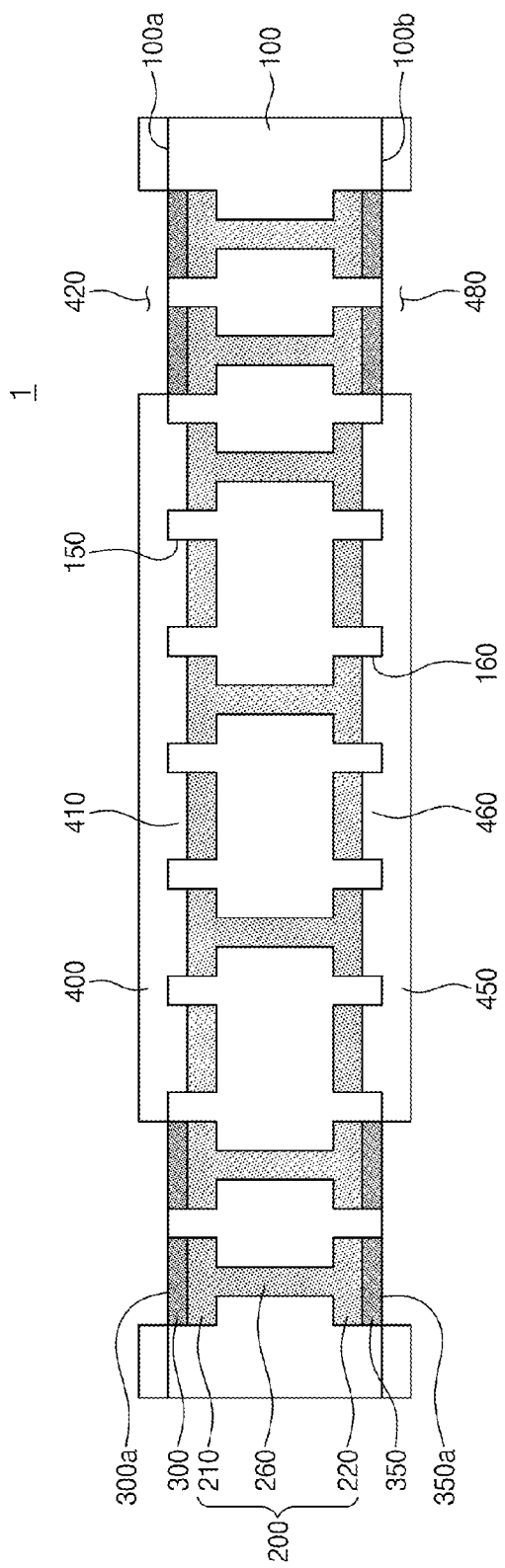
FIGS. 9 and 10 are cross-sectional views illustrating package substrates according to some example embodiments of the inventive concepts.
Figure 10:
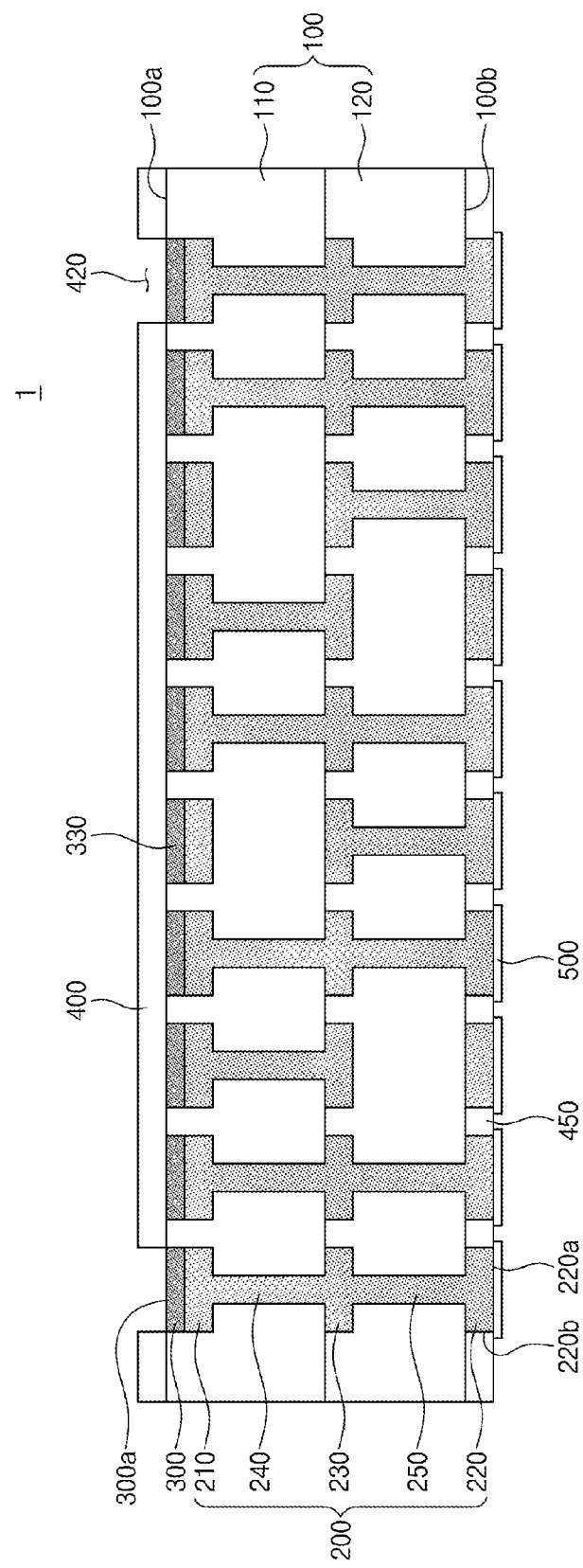

FIGS. 9 and 10 are cross-sectional views illustrating package substrates according to some example embodiments of the inventive concepts. Hereinafter, the descriptions to the same elements as in the example embodiment of FIG. 1 will be omitted or mentioned briefly for ease and convenience of explanation.

Referring to FIG. 9, an insulating layer 100 may have a top surface 100a and a bottom surface 100b opposite to the top surface 100a. A first recess region 150 recessed or depressed toward the bottom surface 100b may be provided at the top surface 100a of the insulating layer 100, and a second recess region 160 recessed or depressed toward the top surface 100a may be provided at the bottom surface 100b of the insulating layer 100.

An interconnection pattern 200 may include a first copper pattern 210 adjacent to the top surface 100a of the insulating layer 100 and a second copper pattern 220 adjacent to the bottom surface 100b of the insulating layer 100. A via 260 may connect at least one first copper pattern 210 to at least one second copper pattern 220.

A first embedded aluminum pad 300 may be disposed on the first copper pattern 210, and a second embedded aluminum pad 350 may be disposed on the second copper pattern 220. The first embedded aluminum pad 300 and the second embedded aluminum pad 350 may be disposed in the insulating layer 100. The first embedded aluminum pad 300 may have a top surface 300a exposed outside the insulating layer 100, and the second embedded aluminum pad 350 may have a bottom surface 350a exposed outside the insulating layer 100. The top surface of the first embedded aluminum pad 300 may be disposed at the same level as the top surface 100a of the insulating layer 100, and the bottom surface 350a of the second embedded aluminum pad 350 may be disposed at the same level as the bottom surface 100b of the insulating layer 100. In other words, the first embedded aluminum pad 300 and the second embedded aluminum pad 350 may not protrude outside the insulating layer 100.

A first protection layer 400, which is disposed on the top surface 100a of the insulating layer 100, may have a first protrusion 410 protruding in a direction from the top surface 100a of the insulating layer 100 toward the bottom surface 100b of the insulating layer 100, and may have a first opening 420 exposing at least one first embedded aluminum pad 300. A second protection layer 450, which is disposed on the bottom surface 100b of the insulating layer 100, may have a second protrusion 460 protruding in a direction from the bottom surface 100b of the insulating layer 100 toward the top surface 100a of the insulating layer 100, and may have a second opening 480 exposing at least one second embedded aluminum pad 350. The first protrusion 410 may fill the first recess region 150, and the second protrusion 460 may fill the second recess region 160.

Referring to FIG. 10, the embedded aluminum pads 300 may be variously arranged. In some example embodiments, the embedded aluminum pads 300 may be provided in both edge portions of the insulating layer 100, and one embedded aluminum pad 300 may be provided in each of the both edge portions of the insulating layer 100. The arrangement of the embedded aluminum pads 300 may be variously modified according to a semiconductor chip (not shown) mounted on the package substrate 1.

The package substrates 1 of FIGS. 9 and 10 may be fabricated by a method similar to the fabrication method described with reference to FIGS. 2A to 2J.

Figure 11:
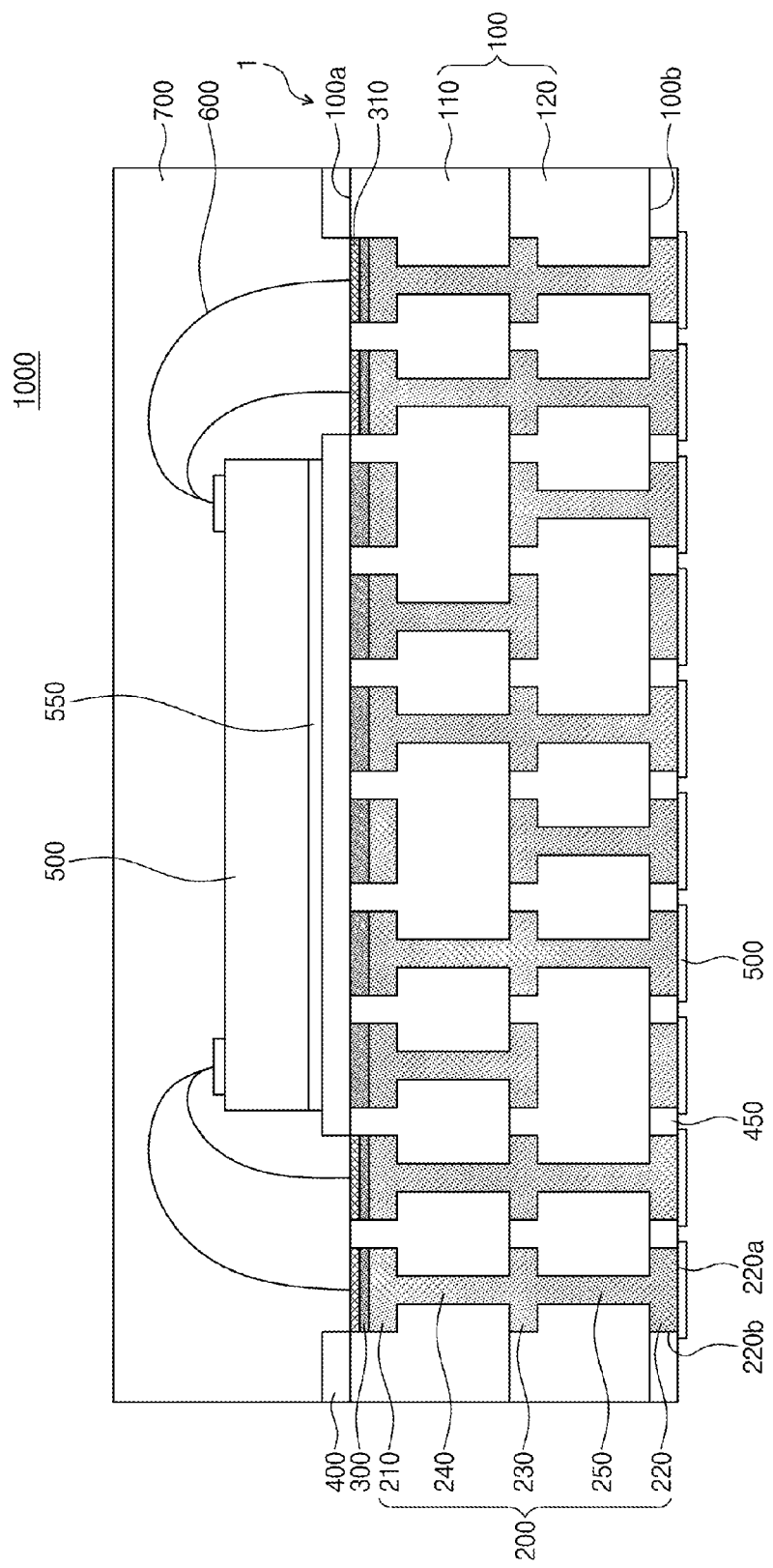
FIG. 11 is a cross-sectional view illustrating a package device including a package substrate according to some example embodiments of the inventive concepts.

FIG. 11 is a cross-sectional view illustrating a package device including a package substrate according to some example embodiments of the inventive concepts. Hereinafter, the descriptions to the same elements as in the example embodiment of FIG. 1 will be omitted or mentioned briefly for ease and convenience of explanation.

Referring to FIG. 11, a semiconductor package (or a package device) 1000 may include the package substrate 1, a semiconductor chip 500, and a mold layer 700.

The semiconductor chip 500 may be disposed on the package substrate 1. The semiconductor chip 500 may be disposed on the first protection layer 400 of the package substrate 1. The semiconductor chip 500 may be a logic chip, a memory chip, or a combination thereof. An adhesive layer 550 may be provided between the semiconductor chip 500 and the package substrate 1.

A bonding wire 600 may electrically connect the package substrate 1 to the semiconductor chip 500. For example, the bonding wire 600 may be formed of copper (Cu) or gold (Au). The bonding wire 600 may electrically connect the semiconductor chip 500 to the embedded aluminum pad 300 of the package substrate 1. Aluminum (Au) may have excellent electrical conductivity but may have an oxidation characteristic. The bonding wire 600 may penetrate the aluminum oxide layer 310 by a stitch bonding process so as to be directly connected to the embedded aluminum oxide layer pad 300.

The mold layer 700 may cover the semiconductor chip 500. The mold layer 700 may include an insulating polymer material such as an epoxy molding compound (EMC).

According to some example embodiments of the inventive concepts, the pad of the package substrate may be formed of low-priced aluminum, thereby reducing the fabrication cost of the package substrate.

According to some example embodiments of the inventive concepts, the package substrate of which the surface is treated using aluminum may be bonded to the semiconductor chip by the bonding wire. The bonding wire may penetrate the oxide layer formed on the embedded aluminum pad to electrically connect the embedded aluminum pad to the semiconductor chip.

According to some example embodiments of the inventive concepts, the aluminum pad may not protrude outside the package substrate, and thus the thickness of the package substrate may be reduced. Further, a plurality of the embedded aluminum pads may be inserted in the insulating layer such that the distance between adjacent ones of the embedded aluminum pads is increased. Thus, reliability of the wire bonding process may be improved.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

The invention claimed is:

1. A package substrate comprising:
    an insulating layer having a top surface and a bottom surface opposite to the top surface;
    at least one first copper pattern in the insulating layer, the at least one first copper pattern adjacent to the top surface of the insulating layer;
    at least one second copper pattern on the bottom surface of the insulating layer; and
    at least one embedded aluminum pad on the at least one first copper pattern, the at least one embedded aluminum pad in the insulating layer such that a top surface of the at least one embedded aluminum pad is exposed by the insulating layer,
    wherein the top surface of the at least one embedded aluminum pad is at a same level as the top surface of the insulating layer, and the at least one embedded aluminum pad is on top of the at least one first copper pattern.

2. The package substrate of claim 1, wherein:
    the at least one first copper pattern includes a plurality of first copper patterns; and
    the at least one embedded aluminum pad includes a plurality of embedded aluminum pads.

3. The package substrate of claim 2, wherein a distance between adjacent ones of the plurality of embedded aluminum pads is equal to or greater than a distance between corresponding adjacent ones of the plurality of first copper patterns.

4. The package substrate of claim 2, wherein a width of each of the plurality of embedded aluminum pads is equal to or smaller than a width of a corresponding one of the plurality of first copper patterns.

5. The package substrate of claim 1, further comprising:
    a first protection layer on the top surface of the insulating layer, the first protection layer having an opening exposing the at least one embedded aluminum pad; and
    a second protection layer on the bottom surface of the insulating layer, the second protection layer exposing a bottom surface of the at least one second copper pattern.

6. The package substrate of claim 5, wherein the at least one embedded aluminum pad is in the opening.

7. The package substrate of claim 5, wherein:
    the at least one embedded aluminum pad includes a plurality of embedded aluminum pads;
    two or more of the plurality of embedded aluminum pads are in each of both edge portions of the insulating layer; and
    the first protection layer exposes the embedded aluminum pads, which is in the both edge portions of the insulating layer.

8. The package substrate of claim 5, wherein:
    the at least one first copper pattern includes a plurality of first copper patterns;
    at least one of the plurality of first copper patterns is covered by the first protection layer; and
    the first protection layer has at least one protrusion that protrudes from the top surface of the insulating layer toward the bottom surface of the insulating layer such that the at least one protrusion is in contact with a corresponding one of the plurality of first copper patterns.

9. The package substrate of claim 5, further comprising:
a coating layer covering the bottom surface of the at least one second copper pattern.

10. The package substrate of claim 1, further comprising:
a barrier layer between the at least one embedded aluminum pad and the at least one first copper pattern,
wherein the barrier layer includes at least one of nickel (Ni), titanium (Ti), tantalum (Ta), titanium nitride (TiN), tantalum nitride (TaN), gold (Au), silver (Ag), or tungsten (W).

11. The package substrate of claim 1, further comprising:
an aluminum oxide layer on the top surface of the embedded aluminum pad, the aluminum oxide layer exposed by the insulating layer, a top surface of the aluminum oxide layer at a same level as the top surface of the insulating layer.

12. A package substrate comprising:
an insulating layer including via holes;
conductive vias filling the via holes;
a plurality of first metal patterns in the insulating layer, the plurality of first metal pattern adjacent to a top surface of the insulating layer, the plurality of first metal pattern predominantly including copper;
a plurality of second metal patterns in the insulating layer, the plurality of second metal patterns adjacent to a bottom surface of the insulating layer, the plurality of second metal pattern predominantly including copper; and
at least one first embedded metal pad on at least one of the plurality of first metal patterns, the at least one first embedded metal pad in the insulating layer such that a top surface of the at least one first embedded metal pad is exposed by the insulating layer, the at least one first embedded metal pad predominantly including aluminum,
wherein the top surface of the at least one first embedded metal pad is at a same level as the top surface of the insulating layer, and the at least one first embedded metal pad is on top of the at least one of the plurality of first metal patterns.

13. The package substrate of claim 12, wherein the at least one first embedded metal pad includes two or more first embedded metal pads.

14. The package substrate of claim 13, wherein a distance between adjacent ones of the two or more first embedded metal pads is equal to or greater than a distance between corresponding adjacent ones of the plurality of first metal patterns.

15. The package substrate of claim 12, further comprising:
a first protection layer on the top surface of the insulating layer, the first protection layer having an opening exposing the at least one first embedded metal pad.

16. The package substrate of claim 15, wherein the at least one first embedded metal pad are not provided on the plurality of first metal patterns, which are embedded in the insulating layer and located under the first protection layer.

17. A package substrate comprising:
an insulating layer having a top surface and a bottom surface opposite to the top surface;
at least one first copper pattern in the insulating layer, the at least one first copper pattern being adjacent to the top surface of the insulating layer;
at least one second copper pattern on the bottom surface of the insulating layer;
at least one embedded aluminum pad on the at least one first copper pattern, the at least one embedded aluminum pad being in the insulating layer such that a top surface of the at least one embedded aluminum pad is exposed by the insulating layer; and
a first protection layer on the top surface of the insulating layer, the first protection layer exposing the top surface of the at least one embedded aluminum pad,
wherein a top surface of the at least one first copper pattern is positioned at a level lower than a bottom surface of the first protection layer.

18. The package substrate of claim 17, wherein a bottom surface of the at least one embedded aluminum pad is lower than the bottom surface of the first protection layer.

19. The package substrate of claim 17, wherein the first protection layer is in contact with the top surface of the insulating layer.

20. The package substrate of claim 17, further comprising:
a second protection layer on the bottom surface of the insulating layer, the second protection layer exposing a bottom surface of the at least one second copper pattern.

* * * * *